(12) United States Patent
Katrak

(10) Patent No.: US 11,398,647 B2
(45) Date of Patent: Jul. 26, 2022

(54) BATTERY MANAGEMENT SYSTEM

(71) Applicant: LG Chem, Ltd., Seoul (KR)

(72) Inventor: Kerfegar K. Katrak, Fenton, MI (US)

(73) Assignee: LG Energy Solution, Ltd., Seoul (KR)

( * ) Notice: Subject to any disclaimer, the term of this patent is extended or adjusted under 35 U.S.C. 154(b) by 1050 days.

(21) Appl. No.: 16/032,293

(22) Filed: Jul. 11, 2018

(65) Prior Publication Data
US 2019/0044192 A1 Feb. 7, 2019

Related U.S. Application Data

(60) Provisional application No. 62/539,636, filed on Aug. 1, 2017.

(51) Int. Cl.
*H01M 10/42* (2006.01)
*H02J 7/04* (2006.01)
*H03K 19/173* (2006.01)
*H02J 7/00* (2006.01)

(52) U.S. Cl.
CPC ......... *H01M 10/425* (2013.01); *H02J 7/0021* (2013.01); *H02J 7/045* (2013.01); *H03K 19/1733* (2013.01); *H01M 2010/4271* (2013.01)

(58) Field of Classification Search
None
See application file for complete search history.

(56) References Cited

U.S. PATENT DOCUMENTS

2009/0115653 A1* 5/2009 Katrak .................... B60L 58/21
341/173

OTHER PUBLICATIONS

Currie et al. PSoC3/5 Reference Book, 2010, MIT (Year: 2010).*
U.S. Appl. No. 16/013,130, filed Jun. 20, 2018 entitled Battery Cell Management System That Detects Data Misalignment Between Battery Cell Voltage Values and Battery Cell Overvoltage Flags.
U.S. Appl. No. 16/028,092, filed Jul. 5, 2018 entitled Battery Cell Management System.
U.S. Appl. No. 16/031,333, filed Jul. 10, 2018 entitled Battery Management System That Detects Communication Faults.
U.S. Appl. No. 16/046,965, filed Jul. 26, 2018 entitled Self-Diagnosing Battery Cell Monitoring System.

* cited by examiner

*Primary Examiner* — Roy Y Yi
(74) *Attorney, Agent, or Firm* — Buckert Patent & Trademark Law Firm PC; John F. Buckert

(57) ABSTRACT

A battery management system includes a microcontroller having a first diagnostic handler application and first and second applications. The first application sets a first non-recoverable diagnostic flag to a first encoded value having each nibble thereof selected from an odd Karnaugh set of binary values. The second application sets a second non-recoverable diagnostic flag to a second encoded value having each nibble thereof selected from an even Karnaugh set of binary values. The first diagnostic handler application sets a first master non-recoverable diagnostic flag to a first encoded fault value if the first non-recoverable diagnostic flag is equal to a second encoded fault value, or the second non-recoverable diagnostic flag is equal to a third encoded fault value.

15 Claims, 8 Drawing Sheets

|  | ENCODED FAULT VALUE (HEXADECIMAL) | ENCODED NON-FAULT VALUE (HEXADECIMAL) |
|---|---|---|
| FIRST NON-RECOVERABLE DIAGNOSTIC FLAG | ED41 | B714 |

FIG. 3

| FLAG | ENCODED FAULT VALUE (HEXADECIMAL) | ENCODED NON-FAULT VALUE (HEXADECIMAL) |
|---|---|---|
| SECOND NON-RECOVERABLE DIAGNOSTIC FLAG | 53C9 | 359C |

FIG. 4

| FLAG | ENCODED FAULT VALUE (HEXADECIMAL) | ENCODED NON-FAULT VALUE (HEXADECIMAL) |
|---|---|---|
| FIRST RECOVERABLE DIAGNOSTIC FLAG | 5AA5 | A55A |

FIG. 5

| FLAG | ENCODED FAULT VALUE (HEXADECIMAL) | ENCODED NON-FAULT VALUE (HEXADECIMAL) |
|---|---|---|
| FIRST MASTER NON-RECOVERABLE DIAGNOSTIC FLAG | 2BD1 | B21D |

FIG. 6

| FLAG | ENCODED FAULT VALUE (HEXADECIMAL) | ENCODED NON-FAULT VALUE (HEXADECIMAL) |
|---|---|---|
| FIRST MASTER RECOVERABLE DIAGNOSTIC FLAG | E847 | 8E74 |

FIG. 7

BATTERY MANAGEMENT SYSTEM

CROSS-REFERENCE TO RELATED APPLICATION

This application claims priority to U.S. Provisional Patent Application No. 62/539,636 filed on Aug. 1, 2017, the entire contents of which are hereby incorporated by reference herein.

BACKGROUND

The inventor herein has recognized a need for an improved battery cell system that utilizes non-recoverable diagnostic flags having each nibble thereof selected from an odd Karnaugh set of binary values, and non-recoverable diagnostic flags having each nibble thereof selected from an even Karnaugh set of binary values to allow freedom from interference among the diagnostic flags.

SUMMARY

A battery management system in accordance with an exemplary embodiment is provided. The battery management system includes a microcontroller having a first diagnostic handler application and first and second applications. The first application sets a first non-recoverable diagnostic flag to a first encoded value and sends the first non-recoverable diagnostic flag to the first diagnostic handler application. The first encoded value has each nibble thereof selected from an odd Karnaugh set of binary values. The second application sets a second non-recoverable diagnostic flag to a second encoded value and sends the second non-recoverable diagnostic flag to the first diagnostic handler application. The second encoded value has each nibble thereof selected from an even Karnaugh set of binary values. The first diagnostic handler application sets a first master non-recoverable diagnostic flag to a first encoded fault value if the first non-recoverable diagnostic flag is equal to a second encoded fault value, or the second non-recoverable diagnostic flag is equal to a third encoded fault value.

BRIEF DESCRIPTION OF THE DRAWINGS

FIG. 3 is a table having a fault value and a non-fault value for a first non-recoverable diagnostic flag utilized by the first application in FIG. 2;

FIG. 4 is a table having a fault value and a non-fault value for a second non-recoverable diagnostic flag utilized by the second application in FIG. 2;

FIG. 5 is a table having a fault value and a non-fault value for a first recoverable diagnostic flag utilized by the third application in FIG. 2;

FIG. 6 is a table having a fault value and a non-fault value for a first master non-recoverable diagnostic flag utilized by the first diagnostic handler application in FIG. 2;

FIG. 7 is a table having a fault value and a non-fault value for a first master recoverable diagnostic flag utilized by the first diagnostic handler application in FIG. 2;

DETAILED DESCRIPTION

Figure 1:
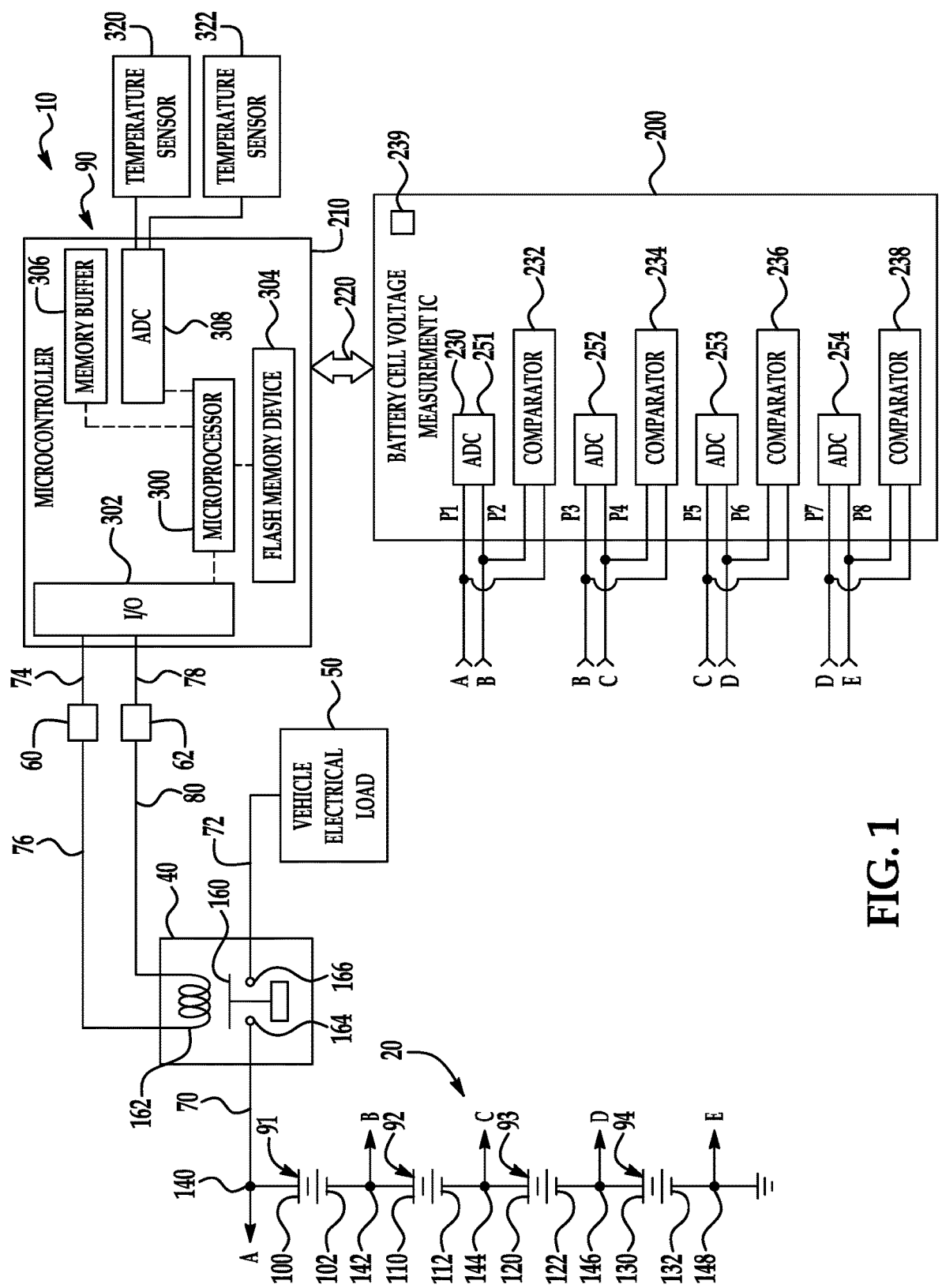
FIG. 1 is a schematic of a vehicle having a battery pack and a battery management system in accordance with an exemplary embodiment.

Referring to FIG. 1, a vehicle 10 is provided. The vehicle 10 includes a battery pack 20, a contactor 40, a vehicle electrical load 50, voltage drivers 60, 62, electrical lines 70, 72, 74, 76, 78, 80, and a battery management system 90.

An advantage of the battery management system 90 is that the system 90 utilizes non-recoverable diagnostic flags having each nibble thereof selected from an odd Karnaugh set of binary values, and non-recoverable diagnostic flags having each nibble thereof selected from an even Karnaugh set of binary values to allow freedom from interference among the diagnostic flags. Further, the system 90 utilizes recoverable diagnostic flags having each nibble thereof selected from an odd Karnaugh set of binary values, and recoverable diagnostic flags having each nibble thereof selected from an even Karnaugh set of binary values to allow freedom from interference among the diagnostic flags.

For purposes of understanding, a few terms utilized herein will be described.

The term "node" or "electrical node" refers to a region or a location in an electrical circuit.

The term "IC" refers to an integrated circuit

The term "odd Karnaugh set of values" corresponds to numbers (decimal or hexadecimal) having corresponding binary numbers with an odd number of 0 bits and an odd number of 1 bits in a nibble. For example, the decimal numbers 1, 2, 4, 7, 8, 11, 13 and 14 are an odd Karnaugh set of values. In particular, the number 7 corresponds to a binary number 0111.

The term "even Karnaugh set of values" corresponds to numbers (decimal or hexadecimal) having corresponding binary numbers with an even number of 0 bits and an even number of 1 bits (for numbers greater than zero) in a nibble. For example, the decimal numbers 0, 3, 5, 6, 9, 10, 12 and 15 are an odd Karnaugh set of values. In particular, the number 5 corresponds to a binary number 0101.

The term "non-recoverable diagnostic flag" refers to a flag which when set to encoded fault value induces the battery management system 90 to take safe action by transitioning a contactor 40 to an open operational position to electrically de-couple the battery pack 20 from the vehicle electrical load 50. Further, thereafter, the battery management system 90 maintains the contactor 40 in the open operational position even if the non-recoverable diagnostic flag is set to an encoded non-fault value.

The term "recoverable diagnostic flag" refers to a flag which when set to encoded fault value induces the battery management system 90 to take safe action by transitioning a contactor 40 to an open operational position to electrically de-couple the battery pack 20 from the vehicle electrical load 50. Further, thereafter, the battery management system 90 can transition the contactor 40 to a closed operational position (e.g., recovers the closed operational state) if the recoverable diagnostic flag is set to an encoded non-fault value.

The battery pack 20 includes first, second, third, fourth battery cells 91, 92, 93, 94 that are electrically coupled in series to one another. The first battery cell 91 includes a positive terminal 100 and a negative terminal 102, and the second battery cell 92 includes a positive terminal 110 and a negative terminal 112. Further, the third battery cell 93 includes a positive terminal 120 and a negative terminal 122, and the fourth battery cell 94 includes a positive terminal 130 and a negative terminal 132. The negative terminal 100 is electrically coupled to the positive terminal 110, and the negative terminal 112 is electrically coupled to the positive terminal 120. Further, the negative terminal 122 is electrically coupled to the positive terminal 130, and the negative terminal 132 is electrically coupled to electrical ground.

An electrical node 140 is electrically coupled to the positive terminal 100 of the first battery cell 91, and is further electrically coupled to the analog-to-digital converter 230, in the battery cell voltage measurement IC 200. Also, an electrical node 142 is electrically coupled to the positive terminal 110 of the second battery cell 92, and is further electrically coupled to the battery cell voltage measurement IC 200. Further, an electrical node 144 is electrically coupled to the positive terminal 120 of the third battery cell 93, and is further electrically coupled to the battery cell voltage measurement IC 200. Also, an electrical node 146 is electrically coupled to the positive terminal 130 of the fourth battery cell 94, and is further electrically coupled to the battery cell voltage measurement IC 200. Further, an electrical node 148 is electrically coupled to electrical ground, and is further electrically coupled to the battery cell voltage measurement IC 200.

The contactor 40 has a contact 160, a contactor coil 162, a first electrical node 164, and a second electrical node 166. The first electrical node 164 is electrically coupled to the positive terminal 100 of the first battery cell 91 via the electrical line 70. The second electrical node 166 is electrically coupled to the vehicle electrical load 50 via the electrical line 72. A first end of the contactor coil 162 is electrically coupled to the voltage driver 60 via the electrical line 76. The voltage driver 60 is further electrical coupled to the digital input-output device 302 of the microcontroller 210 via the electrical line 74. A second end of the contactor coil 162 is electrically coupled to the voltage driver 62 via the electrical line 80. The voltage driver 62 is further electrically coupled to the digital input-output device 302 of the microcontroller 210 via the electrical line 78.

When the microcontroller 210 generates first and second control signals that are received by the voltage drivers 60, 62, respectively, the contactor coil 162 is energized which transitions the contact 160 to a closed operational state, which results in the vehicle electrical load 50 receiving a voltage from the battery pack 20. Alternately, when the microcontroller 210 generates third and fourth control signals that are received by the voltage drivers 60, 62, respectively, the contactor coil 162 is de-energized which transitions the contact 160 to an open operational position. In an exemplary embodiment, the third and fourth control signals can each be a ground voltage level.

The battery management system 90 is provided to determine battery cell voltage values associated with the first, second, third, fourth battery cells 91, 92, 93, 94, and to determine overvoltage fault bits associated with the battery cells 91-94, and to determine temperature values associated with the battery cells 91-94. The battery management system 90 includes a battery cell voltage measurement IC 200, a microcontroller 210, a communication bus 220, and temperature sensors 320, 322.

The battery cell voltage measurement IC 200 is provided to measure battery cell voltages of the first, second, third, fourth battery cells 91, 92, 93, 94 and to generate associated battery cell voltage values. The battery cell voltage measurement IC 200 is further provided to generate overvoltage fault bits associated with the battery cells 91, 92, 93, 94. The battery cell voltage measurement IC 200 also generates an IC communication chip overvoltage fault bit having a binary "1" value when an overvoltage condition is detected in an IC communication chip 239. The battery cell voltage measurement IC 200 includes an analog-to-digital converter (ADC) 230, and first, second, third, and fourth voltage comparators 232, 234, 236, 238, and the IC communication chip 239.

The ADC 230 includes ADC differential channels 251, 252, 253, 254 for measuring battery cell voltages of the first, second, third, fourth battery cells 91, 92, 93, 94, respectively.

The ADC differential channel 251 has input pins P1, P2 which are electrically coupled to the positive terminal 100 and the negative terminal 102, respectively, of the first battery cell 91 to measure an output voltage of the first battery cell 91 between the terminals 100, 102, and the analog-to-digital converter 230 generates a battery cell voltage value based on the measured output voltage.

The ADC differential channel 252 has input pins P3, P4 which are electrically coupled to the positive terminal 110 and the negative terminal 112, respectively, of the second battery cell 92 to measure an output voltage of the second battery cell 92 between the terminals 110, 112, and the analog-to-digital converter 230 generates a battery cell voltage value based on the measured output voltage.

The ADC differential channel 253 has input pins P5, P6 which are electrically coupled to the positive terminal 120 and the negative terminal 122, respectively, of the third battery cell 93 to measure an output voltage of the third battery cell 93 between the terminals 120, 122, and the analog-to-digital converter 230 generates a battery cell voltage value based on the measured output voltage.

The ADC differential channel 254 has input pins P7, P8 which are electrically coupled to the positive terminal 130 and the negative terminal 132, respectively, of the fourth battery cell 94 to measure an output voltage of the fourth battery cell 94 between the terminals 130, 132, and the analog-to-digital converter 230 generates a battery cell voltage value based on the measured output voltage.

The first voltage comparator 232 is electrically coupled to the input pins P1, P2 of the ADC differential channel 251, and compares the output voltage (between input pins P1, P2) of the first battery cell 91 to a voltage comparator threshold voltage. If the output voltage of the first battery cell 91 is greater than the voltage comparator threshold voltage indicating a cell overvoltage condition, the first voltage comparator 232 sets an associated overvoltage fault bit to a binary "1" value (i.e., a fault value). Otherwise, the first voltage comparator 232 sets the associated overvoltage fault bit to a binary "0" value (i.e., a non-fault value).

The second voltage comparator 234 is electrically coupled to the input pins P3, P4 of the ADC differential channel 252, and compares the output voltage (between input pins P3, P4) of the second battery cell 92 to a voltage comparator threshold voltage. If the output voltage of the second battery cell 92 is greater than the voltage comparator threshold voltage indicating a cell overvoltage condition, the second voltage comparator 234 sets an associated overvoltage fault bit to a binary "1" value (i.e., a fault value). Otherwise, the second voltage comparator 234 sets the associated overvoltage fault bit to a binary "0" value.

The third voltage comparator 236 is electrically coupled to the input pins P5, P6 of the ADC differential channel 253, and compares the output voltage (between input pins P5, P6) of the third battery cell 93 to a voltage comparator threshold voltage. If the output voltage of the third battery cell 93 is greater than the voltage comparator threshold voltage indicating a cell overvoltage condition, the third voltage comparator 236 sets an associated overvoltage fault bit to a binary "1" value (i.e., a fault value). Otherwise, the third voltage comparator 236 sets the associated overvoltage fault bit to a binary "0" value.

The fourth voltage comparator 238 is electrically coupled to the input pins P7, P8 of the ADC differential channel 254, and compares the output voltage (between input pins P7, P8) of the fourth battery cell 94 to a voltage comparator threshold voltage. If the output voltage of the fourth battery cell 94 is greater than the voltage comparator threshold voltage indicating a cell overvoltage condition, the fourth voltage comparator 238 sets an associated overvoltage fault bit to a binary "1" value (i.e., a fault value). Otherwise, the fourth voltage comparator 238 sets the associated overvoltage fault bit to a binary "0" value.

The battery cell voltage measurement IC 200 utilizes the IC communication chip 239 to operably communicate with the microcontroller 210 via the communication bus 220. In particular, the battery cell voltage measurement IC 200 sends battery cell voltage values and overvoltage fault bits to the microcontroller 210, and an IC communication chip overvoltage fault bit via the communication bus 220 to the microcontroller 210.

The microcontroller 210 is provided to control operation of the contactor 40 and to monitor the battery cell voltage values and the overvoltage fault bits associated with the first, second, third, fourth battery cells 91, 92, 93, 94, and to monitor temperature values associated with the battery module 20, and to monitor an IC communication chip overvoltage fault bit associated with the IC communication chip 239. The microcontroller 210 includes a microprocessor 300, a digital input-output device 302, a flash memory device 304, memory buffer 306, and an analog-to-digital converter 308. The microprocessor 300 is operably coupled to the digital input-output device 302, the flash memory device 304, and the memory buffer 306 and the analog-to-digital converter 308. The digital input-output device 302 is electrically coupled to the voltage drivers 60, 62 via the electrical lines 74, 78, respectively.

Figure 2:
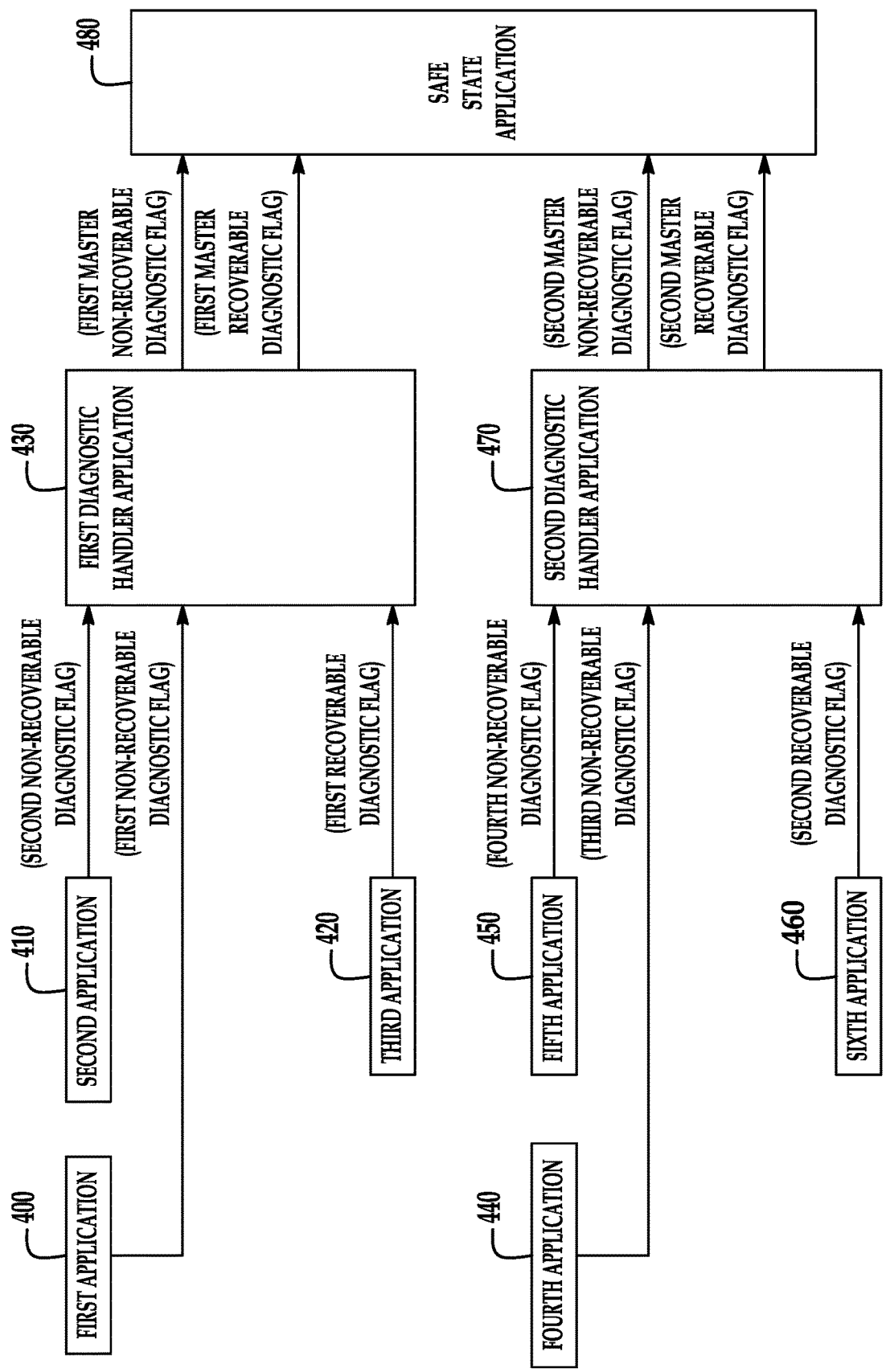
FIG. 2 is a block diagram of applications utilized by the battery management system of FIG. 1 including a first application, a second application, a third application, a first diagnostic handler application, a fourth application, a fifth application, a sixth application, a second diagnostic handler application, and a safe state application.

Referring to FIGS. 1 and 2, the flash memory device 304 includes a first application 400, a second application 410, a third application 420, a first diagnostic handler 430, the fourth application 440, a fifth application 450, a sixth application 460, a second diagnostic handler application 470, and a safe state application 480 which will be explained in greater detail below.

The temperature sensor 320 is operably coupled to the analog-to-digital converter 308 and generates a voltage indicative of a temperature level of at least one of the battery cells 91-94 that is received by the analog-to-digital converter 308. The analog-to-digital converter 308 generates a temperature value indicative of the temperature level based on the received voltage.

The temperature sensor 322 is operably coupled to the analog-to-digital converter 308 and generates a voltage indicative of a temperature level of at least one of the battery cells 91-94 that is received by the analog-to-digital converter 308. The analog-to-digital converter 308 generates a temperature value indicative of the temperature level based on the received voltage.

Referring to FIGS. 2 and 3, a table 550 having a record 552 is illustrated. The record 552 has an encoded fault value (e.g., ED41 hexadecimal), and an encoded non-fault value (e.g., B714 hexadecimal) for a first non-recoverable diagnostic flag utilized by the first application 400 is illustrated.

Referring to FIGS. 2 and 4, a table 560 having a record 562 is illustrated. The record 562 has an encoded fault value (e.g., 53C9 hexadecimal), and an encoded non-fault value (e.g., 359C hexadecimal) for a second non-recoverable diagnostic flag utilized by the second application 410 is illustrated.

Referring to FIGS. 2 and 5, a table 570 having a record 572 is illustrated. The record 572 has an encoded fault value (e.g., 5AA5 hexadecimal), and an encoded non-fault value (e.g., A55A hexadecimal) for a first recoverable diagnostic flag utilized by the third application 420 is illustrated.

Referring to FIGS. 2 and 6, a table 580 having a record 582 is illustrated. The record 582 has an encoded fault value (e.g., 2BD1 hexadecimal), and an encoded non-fault value (e.g., B21D hexadecimal) for a first master non-recoverable diagnostic flag utilized by the first diagnostic handler application 430 is illustrated.

Referring to FIGS. 2 and 7, a table 590 having a record 592 is illustrated. The record 592 has an encoded fault value (e.g., E847 hexadecimal), and an encoded non-fault value (e.g., 8E74 hexadecimal) for a first master recoverable diagnostic flag utilized by the first diagnostic handler application 430 is illustrated.

Figure 8:
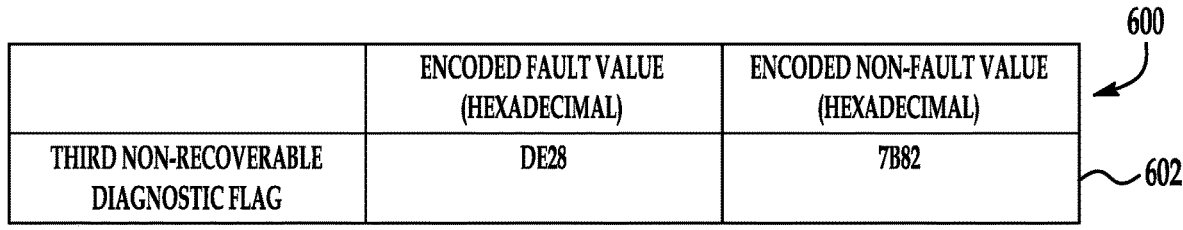
FIG. 8 is a table having a fault value and a non-fault value for a third non-recoverable diagnostic flag utilized by the fourth application in FIG. 2.

Referring to FIGS. 2 and 8, a table 600 having a record 602 is illustrated. The record 602 as an encoded fault value (e.g., DE28 hexadecimal), and an encoded non-fault value (e.g., 7B82 hexadecimal) for a third non-recoverable diagnostic flag utilized by the fourth application 440 is illustrated.

Figure 9:
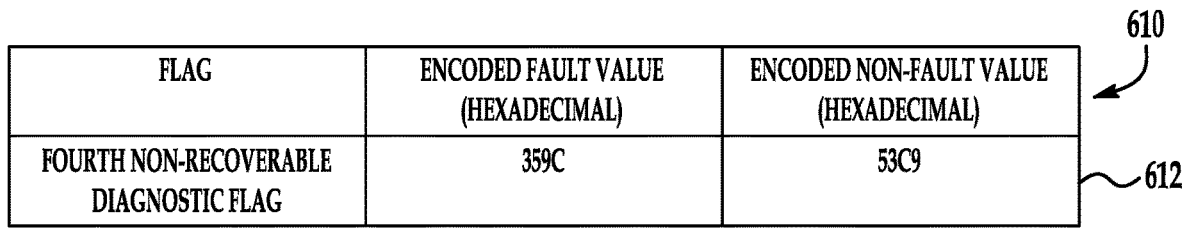
FIG. 9 is a table having a fault value and a non-fault value for a fourth non-recoverable diagnostic flag utilized by the fifth application in FIG. 2.

Referring to FIGS. 2 and 9, a table 610 having a record 612 is illustrated. The record 612 has an encoded fault value (e.g., 359C hexadecimal), and an encoded non-fault value (e.g., 53C9 hexadecimal) for a fourth non-recoverable diagnostic flag utilized by the fifth application 450 is illustrated.

Figure 10:
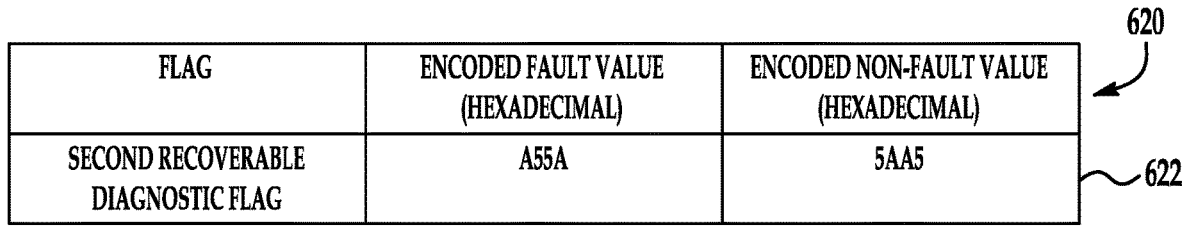
FIG. 10 is a table having a fault value and a non-fault value for a second recoverable diagnostic flag utilized by the sixth application in FIG. 2.

Referring to FIGS. 2 and 10, a table 620 having a record 622 is illustrated. The record 622 has an encoded fault value (e.g., A55A hexadecimal), and an encoded non-fault value (e.g., 5AA5 hexadecimal) for a second recoverable diagnostic flag utilized by the sixth application 460 is illustrated.

Figure 11:
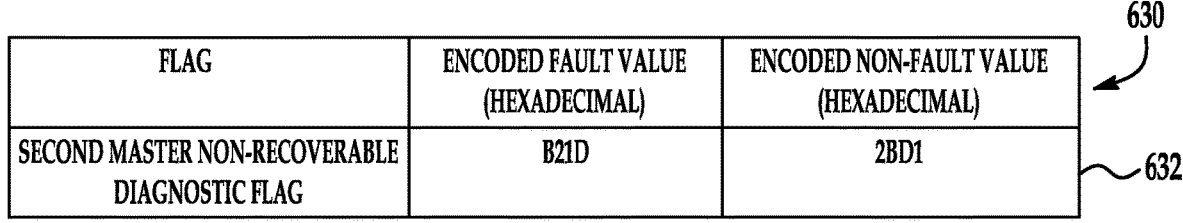
FIG. 11 is a table having a fault value and a non-fault value for a second master non-recoverable diagnostic flag utilized by the second diagnostic handler application in FIG. 2.

Referring to FIGS. 2 and 11, a table 630 having a record 632 is illustrated. The record 632 has an encoded fault value (e.g., B21D hexadecimal), and an encoded non-fault value (e.g., 2BD1 hexadecimal) for a second master non-recoverable diagnostic flag utilized by the second diagnostic handler application 470 is illustrated.

Figure 12:
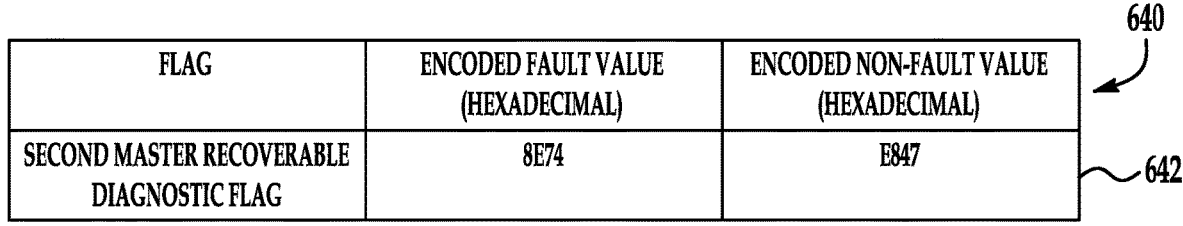
FIG. 12 is a table having a fault value and a non-fault value for a second master recoverable diagnostic flag utilized by the second diagnostic handler application in FIG. 2.
Figure 13:
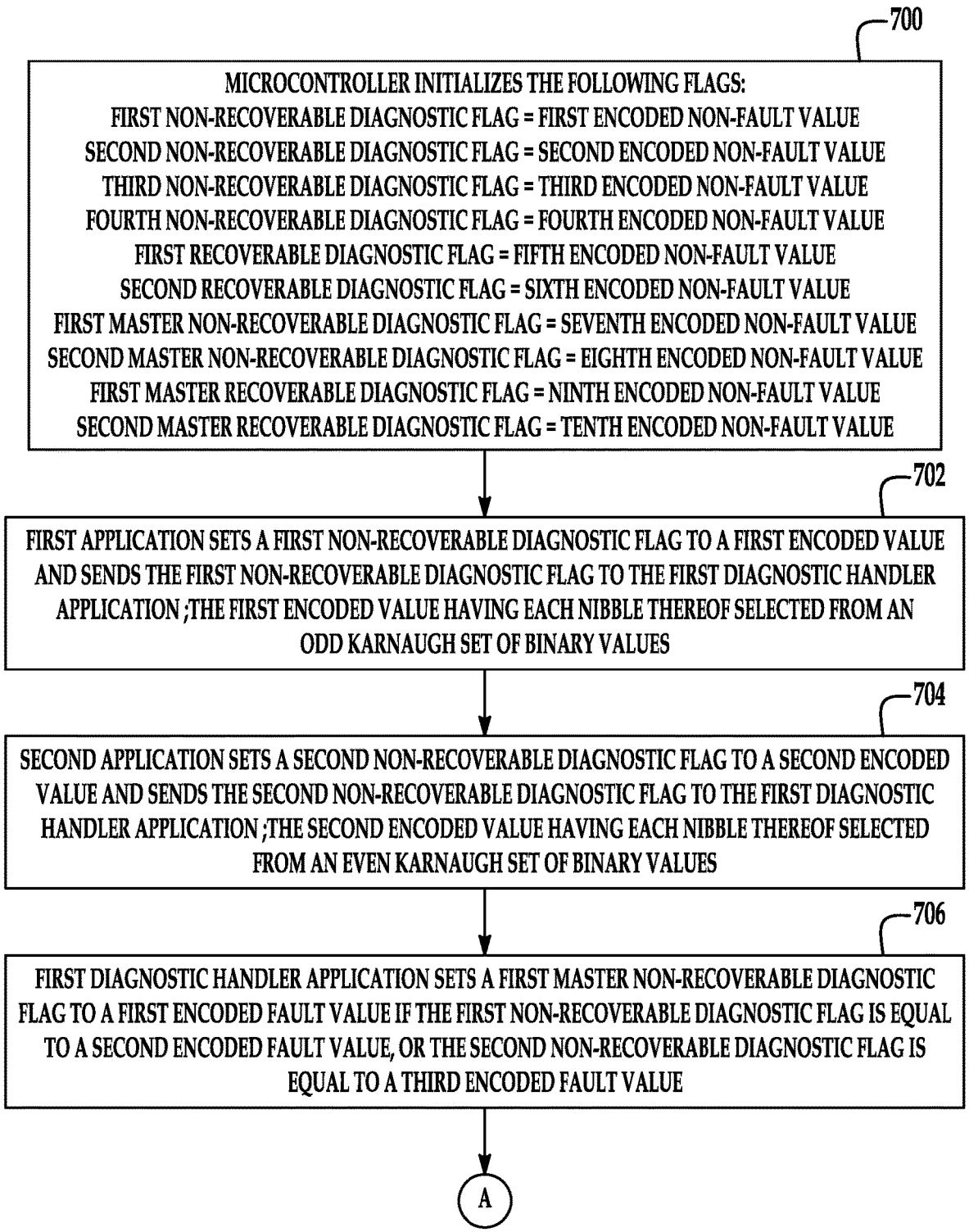
FIGS. 13-16 are flowcharts of a diagnostic method implemented by the battery management system of FIG. 1.
Figure 14:
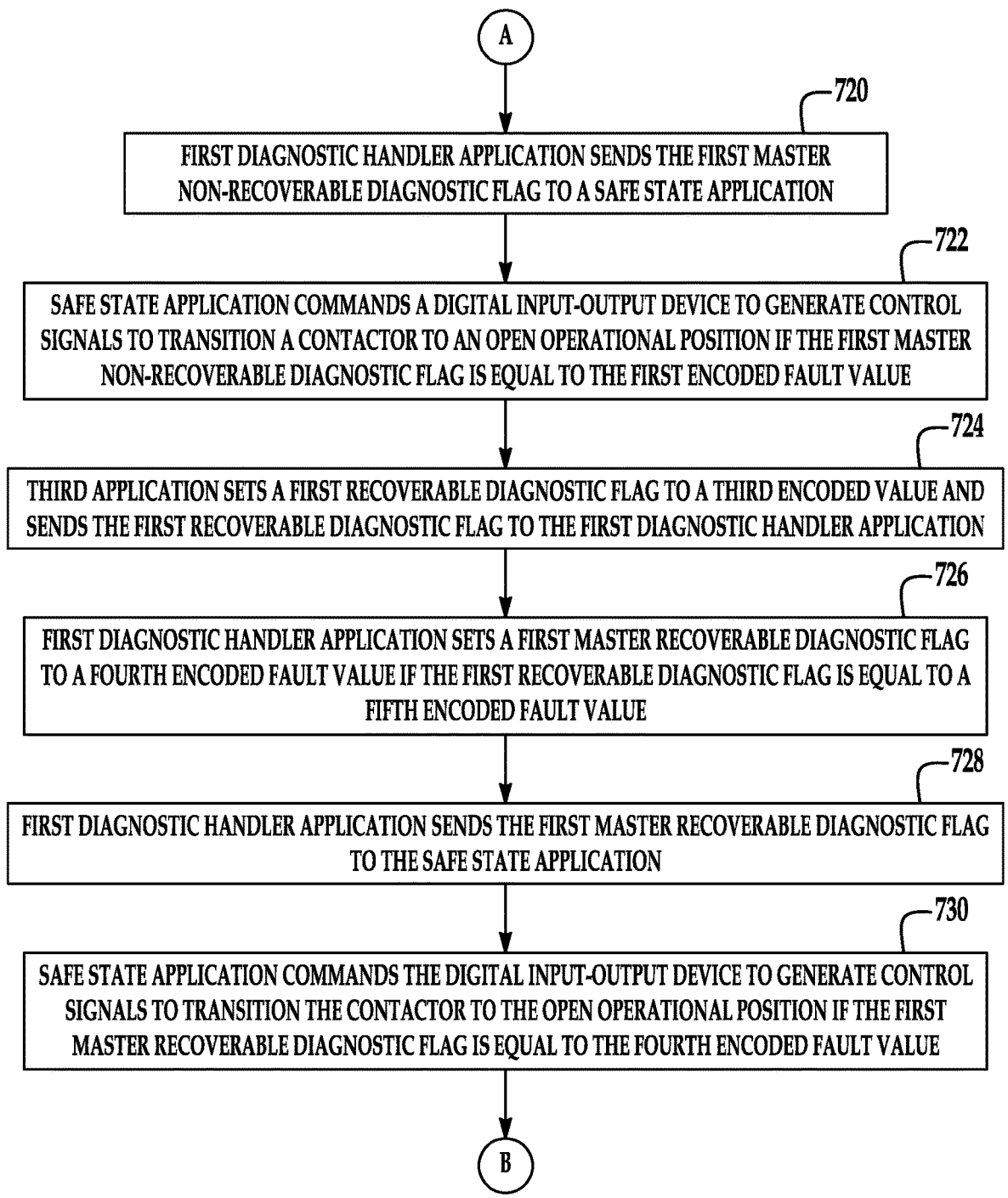
Figure 15:
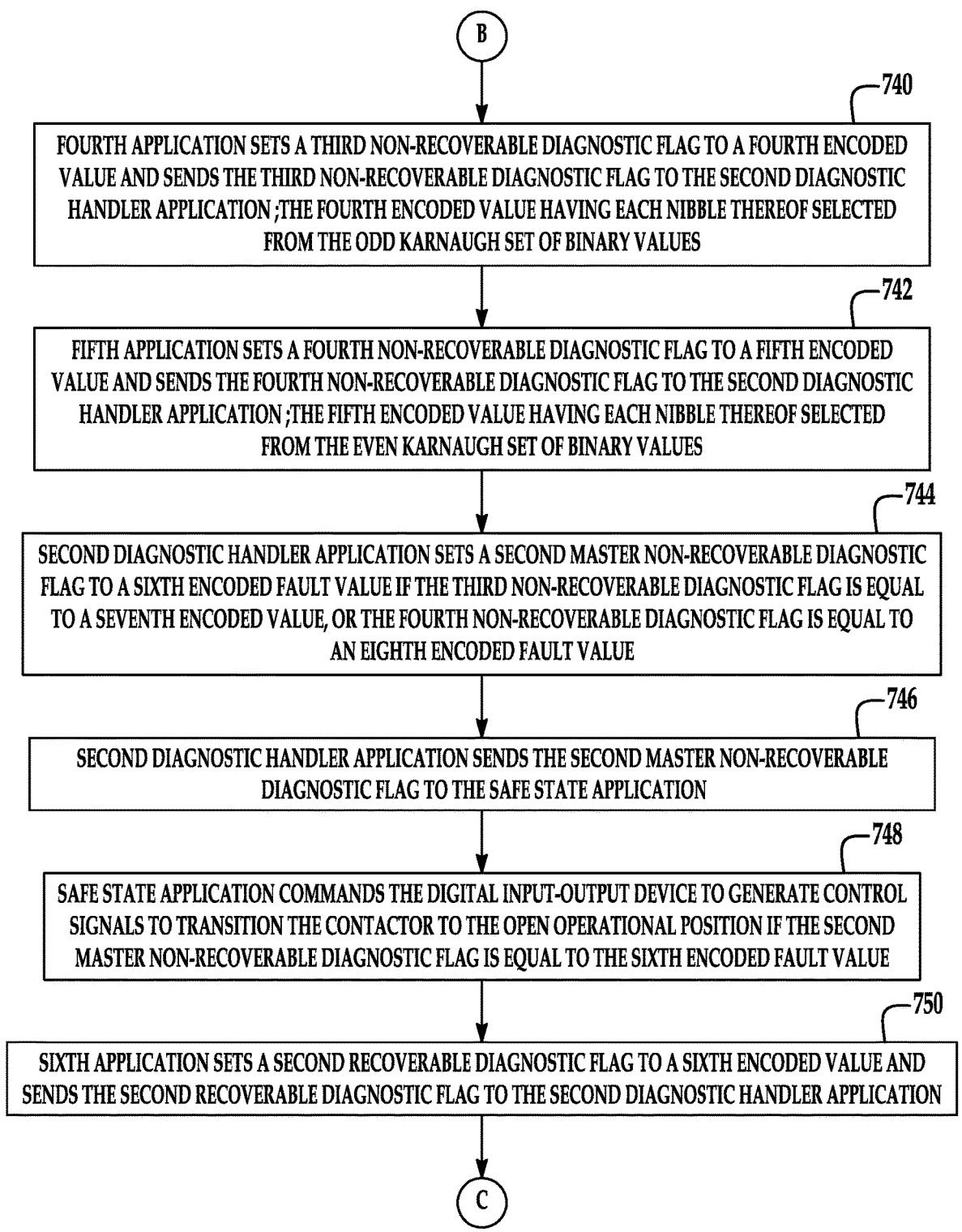
Figure 16:
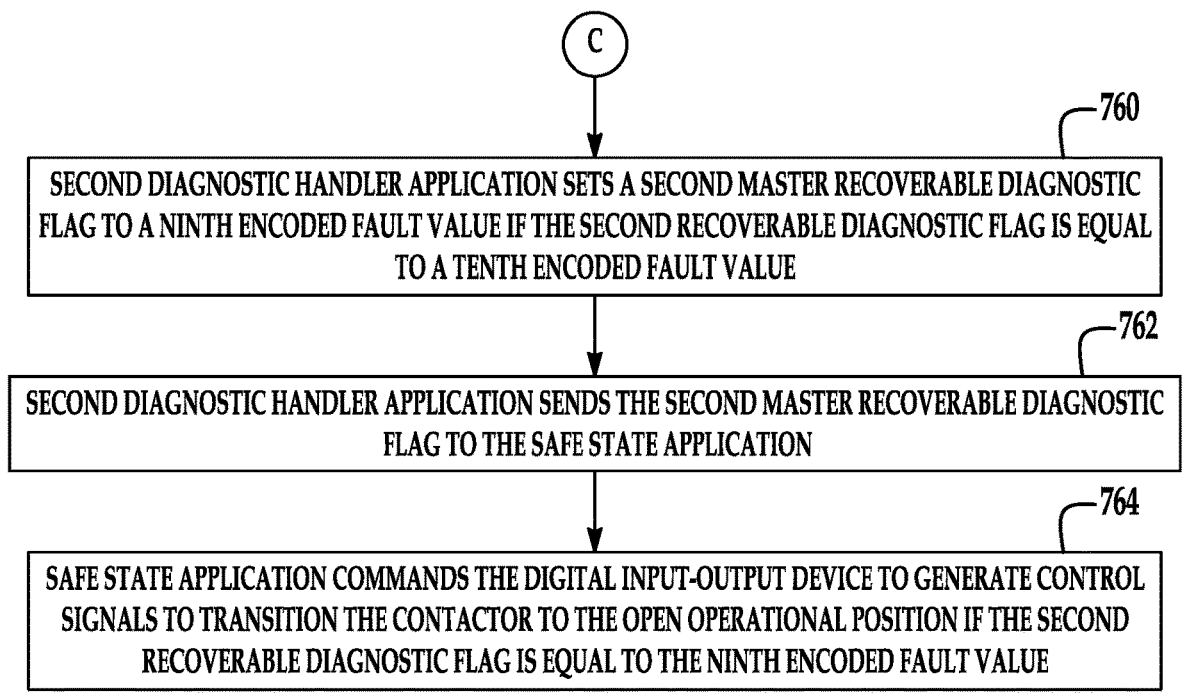

Referring to FIGS. 2 and 12, a table 640 having a record 642 is illustrated. The record 642 has an encoded fault value (e.g., 8E74 hexadecimal), and an encoded non-fault value (e.g., E847 hexadecimal) for a second master recoverable diagnostic flag utilized by the second diagnostic handler application 470 is illustrated.

Referring to FIGS. 3 and 4, the fault values in the tables 550, 560 have a Hamming distance of at least four from one another. Further, the non-fault values in the tables 550, 560 have a Hamming distance of at least four from one another.

Referring to FIGS. 8 and 9, the fault values in the tables 600, 610 have a Hamming distance of at least four from one another. Further, the non-fault values in the tables 600, 610 have a Hamming distance of at least four from one another.

Referring to FIGS. 6 and 11, the fault values in the tables 580, 630 have a Hamming distance of at least four from one another. Further, the non-fault values in the tables 580, 630 have a Hamming distance of at least four from one another.

Referring to FIGS. 7 and 12, the fault values in the tables 590, 640 have a Hamming distance of at least four from one another. Further, the non-fault values in the tables 590, 640 have a Hamming distance of at least four from one another.

Referring to FIGS. 1, 2 and 13-16, a flowchart of a diagnostic method implemented by the diagnostic system 90 will be explained.

At step 700, the microcontroller 210 initializes the following flags:

first non-recoverable diagnostic flag=first encoded non-fault value (e.g., B714 hexadecimal from table 550 in FIG. 3);

second non-recoverable diagnostic flag=second encoded non-fault value (e.g., 359C hexadecimal from table 560 in FIG. 4);

third non-recoverable diagnostic flag=third encoded non-fault value (e.g., 7B82 hexadecimal from table 600 in FIG. 8);

fourth non-recoverable diagnostic flag=fourth encoded non-fault value (e.g., 53C9 hexadecimal from table 610 in FIG. 9);

first recoverable diagnostic flag=fifth encoded non-fault value (e.g., A55A hexadecimal from table 570 in FIG. 5);

second recoverable diagnostic flag=sixth encoded non-fault value (e.g., 5AA5 hexadecimal from table 620 in FIG. 10);

first master non-recoverable diagnostic flag=seventh encoded non-fault value (e.g., B21D hexadecimal from table 580 in FIG. 6);

second master non-recoverable diagnostic flag=eighth encoded non-fault value (e.g., 2BD1 hexadecimal from table 630 in FIG. 11);

first master recoverable diagnostic flag=ninth encoded non-fault value (e.g., 8E74 hexadecimal from table 590 in FIG. 7);

second master recoverable diagnostic flag=tenth encoded non-fault value (e.g., E847 hexadecimal from table 640 in FIG. 12).

At step 702, the first application 400 sets a first non-recoverable diagnostic flag to a first encoded value and sends the first non-recoverable diagnostic flag to the first diagnostic handler application 430. The first encoded value has each nibble thereof selected from an odd Karnaugh set of binary values.

For example, if the first application 400 detects an overvoltage fault bit of binary "1" for at least one of the battery cells 91-94, the first encoded value is ED41 hexadecimal (from table 550 in FIG. 3). Alternately, if the first application 400 does not detect an overvoltage fault bit of binary "1" for at least one of the battery cells 91-94, the first encoded value is B714 hexadecimal (from table 550 in FIG. 3).

At step 704, the second application 410 sets a second non-recoverable diagnostic flag to a second encoded value and sends the second non-recoverable diagnostic flag to the first diagnostic handler application 430. The second encoded value has each nibble thereof selected from an even Karnaugh set of binary values.

For example, if the second application 410 detects an IC communication chip overvoltage fault bit having a binary "1" value indicating an overvoltage condition in the IC communication chip 239, the second encoded value is 53C9 hexadecimal (from table 560 in FIG. 4). Alternately, if the second application 410 does not detect the IC communication chip overvoltage fault bit having the binary "1" value, the second encoded value is 359C hexadecimal (from table 560 in FIG. 4).

At step 706, the first diagnostic handler application 430 sets a first master non-recoverable diagnostic flag to a first encoded fault value (e.g., 2BD1 hexadecimal from table 580 in FIG. 6) if the first non-recoverable diagnostic flag is equal to a second encoded fault value (e.g., ED41 hexadecimal from table 550 of FIG. 3), or the second non-recoverable diagnostic flag is equal to a third encoded fault value (e.g., 53C9 hexadecimal from table 560 in FIG. 4).

At step 720, the first diagnostic handler application 430 sends the first master non-recoverable diagnostic flag to a safe state application 480.

At step 722, the safe state application 480 commands a digital input-output device 302 to generate control signals to transition a contactor 40 to an open operational position if the first master non-recoverable diagnostic flag is equal to the first encoded fault value.

At step 724, the third application 420 sets a first recoverable diagnostic flag to a third encoded value and sends the first recoverable diagnostic flag to the first diagnostic handler application 430.

For example, if the third application 420 detects a high temperature fault condition (>threshold temperature) of the battery cells 91-94, the third encoded value is 5AA5 hexadecimal (from table 570 in FIG. 5). Alternately, if the third application 420 does not detect a high temperature fault condition, the third encoded value is A55A hexadecimal (from table 570 in FIG. 5).

At step 726, the first diagnostic handler application 430 sets a first master recoverable diagnostic flag to a fourth encoded fault value (e.g., E847 hexadecimal from table 590 in FIG. 7) if the first recoverable diagnostic flag is equal to a fifth encoded fault value (e.g., 5AA5 hexadecimal from table 570 in FIG. 5).

At step 728, the first diagnostic handler application 430 sends the first master recoverable diagnostic flag to the safe state application 480.

At step 730, the safe state application 480 commands the digital input-output device 302 to generate control signals to transition the contactor 40 to the open operational position if the first master recoverable diagnostic flag is equal to the fourth encoded fault value.

At step 740, the fourth application 440 sets a third non-recoverable diagnostic flag to a fourth encoded value and sends the third non-recoverable diagnostic flag to the second diagnostic handler application 470. The fourth encoded value has each nibble thereof selected from the odd Karnaugh set of binary values.

For example, if the fourth application 440 detects overvoltage fault bit of binary "1" for at least one of the battery cells 91-94, the fourth encoded value is DE28 hexadecimal (from table 600 in FIG. 8). Alternately, if the fourth application 440 does not detect an overvoltage fault bit of binary "1" for at least one of the battery cells 91-94, the fourth encoded value is 7B82 hexadecimal (from table 600 in FIG. 8).

At step 742, the fifth application 450 sets a fourth non-recoverable diagnostic flag to a fifth encoded value and sends the fourth non-recoverable diagnostic flag to the second diagnostic handler application 470. The fifth encoded value has each nibble thereof selected from the even Karnaugh set of binary values.

For example, if the fifth application 450 detects an IC communication chip overvoltage fault bit having a binary "1" value indicating an overvoltage condition in the IC communication chip 239, the fifth encoded value is 359C hexadecimal (from table 610 in FIG. 9). Alternately, if the fifth application 450 does not detect an IC communication chip overvoltage fault bit having the binary "1" value, the fifth encoded value is 53C9 hexadecimal (from table 610 in FIG. 9).

At step 744, the second diagnostic handler application 470 sets a second master non-recoverable diagnostic flag to a sixth encoded fault value (e.g., B21D hexadecimal from table 630 in FIG. 11) if the third non-recoverable diagnostic flag is equal to a seventh encoded fault value (e.g., DE28 hexadecimal from table 600 in FIG. 8), or the fourth non-recoverable diagnostic flag is equal to an eighth encoded fault value (e.g., 359C hexadecimal from table 610 in FIG. 9).

At step 746, the second diagnostic handler application 470 sends the second master non-recoverable diagnostic flag to the safe state application 480.

At step 748, the safe state application 480 commands the digital input-output device 302 to generate control signals to transition the contactor 40 to the open operational position if the second master non-recoverable diagnostic flag is equal to the sixth encoded fault value.

At step 750, the sixth application 460 sets a second recoverable diagnostic flag to a sixth encoded value and sends the second recoverable diagnostic flag to the second diagnostic handler application 470.

For example, if the sixth application 460 detects a high temperature fault condition (>threshold temperature) of the battery cells 91-94, the sixth encoded value is A55A hexadecimal (from table 620 in FIG. 10). Alternately, if the sixth application 460 does not detect a high temperature fault condition, the sixth encoded value is 5AA5 hexadecimal (from table 620 in FIG. 10).

At step 760, the second diagnostic handler application 470 sets a second master recoverable diagnostic flag to a ninth encoded fault value (e.g., 8E74 hexadecimal from table 640 in FIG. 12) if the second recoverable diagnostic flag is equal to a tenth encoded fault value.

At step 762, the second diagnostic handler application 470 sends the second master recoverable diagnostic flag to the safe state application 480.

At step 764, the safe state application 480 commands the digital input-output device 302 to generate control signals to transition the contactor 40 to the open operational position if the second recoverable diagnostic flag is equal to the ninth encoded fault value.

The battery management system 90 described herein provides a substantial advantage over other battery cell systems. In particular, the battery management system described herein has a technical effect of utilizing non-recoverable diagnostic flags having each nibble thereof selected from an odd Karnaugh set of binary values, and non-recoverable diagnostic flags having each nibble thereof selected from an even Karnaugh set of binary values to allow freedom from interference among the diagnostic flags. Further, the system 90 utilizes recoverable diagnostic flags having each nibble thereof selected from an odd Karnaugh set of binary values, and recoverable diagnostic flags having each nibble thereof selected from an even Karnaugh set of binary values to allow freedom from interference among the diagnostic flags.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A battery management system, comprising:
a microcontroller having a first diagnostic handler application and first and second applications;
the first application setting a first non-recoverable diagnostic flag to a first encoded value and sending the first non-recoverable diagnostic flag to the first diagnostic handler application; the first encoded value having each nibble thereof selected from an odd Karnaugh set of binary values;
the second application setting a second non-recoverable diagnostic flag to a second encoded value and sending the second non-recoverable diagnostic flag to the first diagnostic handler application; the second encoded value having each nibble thereof selected from an even Karnaugh set of binary values;
the first diagnostic handler application setting a first master non-recoverable diagnostic flag to a first encoded fault value if the first non-recoverable diagnostic flag is equal to a second encoded fault value, or the second non-recoverable diagnostic flag is equal to a third encoded fault value;
wherein the odd Karnaugh set of binary values correspond to numbers having corresponding binary numbers with an odd of 0 bits and an odd number of 1 bits in a nibble and the even Karnaugh set of binary values correspond to numbers having corresponding binary numbers with an even number of 0 bits and an even number of 1 bits in a nibble.

2. The battery management system of claim 1, wherein:
the microcontroller further includes a safe state application;
the first diagnostic handler application sending the first master non-recoverable diagnostic flag to the safe state application;
the safe state application transitioning a contactor to an open operational position if the first master non-recoverable diagnostic flag is equal to the first encoded fault value.

3. The battery management system of claim 1, wherein:
the microcontroller having a third application, the third application setting a first recoverable diagnostic flag to a third encoded value and sending the first recoverable diagnostic flag to the first diagnostic handler application; and
the first diagnostic handler application setting a first master recoverable diagnostic flag to a fourth encoded fault value if the first recoverable diagnostic flag is equal to a fifth encoded fault value.

4. The battery management system of claim 3, wherein:
the microcontroller further includes a safe state application;
the first diagnostic handler application sending the first master recoverable diagnostic flag to the safe state application; and
the safe state application transitioning a contactor to an open operational position if the first master recoverable diagnostic flag is equal to the fourth encoded fault value.

5. The battery management system of claim 3, wherein:
the microcontroller having a second diagnostic handler application and fourth and fifth applications;
the fourth application setting a third non-recoverable diagnostic flag to a fourth encoded value and sending the third non-recoverable diagnostic flag to the second diagnostic handler application; the fourth encoded value having each nibble thereof selected from the odd Karnaugh set of binary values;
the fifth application setting a fourth non-recoverable diagnostic flag to a fifth encoded value and sending the fourth non-recoverable diagnostic flag to the second diagnostic handler application; the fifth encoded value having each nibble thereof selected from the even Karnaugh set of binary values; and
the second diagnostic handler application setting a second master non-recoverable diagnostic flag to a sixth encoded fault value if the third non-recoverable diagnostic flag is equal to a seventh encoded fault value, or the fourth non-recoverable diagnostic flag is equal to an eighth encoded fault value.

6. The battery management system of claim 5, wherein:
the microcontroller further includes a safe state application;
the second diagnostic handler application sending the second master non-recoverable diagnostic flag to the safe state application; and
the safe state application transitioning a contactor to an open operational position if the second master non-recoverable diagnostic flag is equal to the sixth encoded fault value.

7. The battery management system of claim 5, wherein:
the microcontroller having a sixth application, the sixth application setting a second recoverable diagnostic flag to a sixth encoded value and sending the second recoverable diagnostic flag to the second diagnostic handler application; and
the second diagnostic handler application setting a second master recoverable diagnostic flag to a ninth encoded fault value if the second recoverable diagnostic flag is equal to a tenth encoded fault value.

8. The battery management system of claim 7, wherein:
the microcontroller further includes a safe state application;
the second diagnostic handler application sending the second master recoverable diagnostic flag to the safe state application; and
the safe state application transitioning a contactor to an open operational position if the second master recoverable diagnostic flag is equal to the ninth encoded fault value.

9. The battery management system of claim 8, wherein the first and second non-recoverable diagnostic flags have a Hamming distance of at least four from one another.

10. The battery management system of claim 8, wherein the third and fourth non-recoverable diagnostic flags have a Hamming distance of at least four from one another.

11. The battery management system of claim 8, wherein the first and second master non-recoverable diagnostic flags have a Hamming distance of at least four from one another.

12. The battery management system of claim 8, wherein the first and second recoverable diagnostic flags have a Hamming distance of at least four from one another.

13. A battery management system, comprising:
a microcontroller having a first diagnostic handler application and first and second applications;
the first application setting a first non-recoverable diagnostic flag to a first encoded value and sending the first non-recoverable diagnostic flag to the first diagnostic handler application;
the first encoded value having each nibble thereof selected from an odd Karnaugh set of binary values;
the second application setting a second non-recoverable diagnostic flag to a second encoded value and sending the second non-recoverable diagnostic flag to the first diagnostic handler application; the second encoded value having each nibble thereof selected from an even Karnaugh set of binary values;
the first diagnostic handler application setting a first master non-recoverable diagnostic flag to a first encoded fault value if the first non-recoverable diagnostic flag is equal to a second encoded fault value, or the second non-recoverable diagnostic flag is equal to a third encoded fault value;
the microcontroller further includes a safe state application;
the first diagnostic handler application sending the first master non-recoverable diagnostic flag to the safe state application; and
the safe state application transitioning a contactor to an open operational position if the first master non-recoverable diagnostic flag is equal to the first encoded fault value.

14. The battery management system of claim 13, wherein the first and second non-recoverable diagnostic flags have a Hamming distance of at least four from one another.

15. A battery management system, comprising:
a microcontroller having a first diagnostic handler application and first and second applications;
the first application setting a first non-recoverable diagnostic flag to a first encoded value and sending the first non-recoverable diagnostic flag to the first diagnostic handler application;
the first encoded value having each nibble thereof selected from an odd Karnaugh set of binary values;
the second application setting a second non-recoverable diagnostic flag to a second encoded value and sending the second non-recoverable diagnostic flag to the first diagnostic handler application; the second encoded value having each nibble thereof selected from an even Karnaugh set of binary values;
the first diagnostic handler application setting a first master non-recoverable diagnostic flag to a first encoded fault value if the first non-recoverable diagnostic flag is equal to a second encoded fault value, or the second non-recoverable diagnostic flag is equal to a third encoded fault value;
the microcontroller having a third application, the third application setting a first recoverable diagnostic flag to a third encoded value and sending the first recoverable diagnostic flag to the first diagnostic handler application; and the first diagnostic handler application setting a first master recoverable diagnostic flag to a fourth encoded fault value if the first recoverable diagnostic flag is equal to a fifth encoded fault value.

\* \* \* \* \*